(12) United States Patent
Kwan

(10) Patent No.: US 7,630,206 B2
(45) Date of Patent: Dec. 8, 2009

(54) RELEASABLY MOUNTABLE ELECTRONICS COMPONENT

(75) Inventor: Derek Kwan, Ontario (CA)

(73) Assignee: International Business Machines Corporation, Armonk, NY (US)

( * ) Notice: Subject to any disclaimer, the term of this patent is extended or adjusted under 35 U.S.C. 154(b) by 492 days.

(21) Appl. No.: 11/306,078

(22) Filed: Dec. 15, 2005

(65) Prior Publication Data

US 2007/0221401 A1 Sep. 27, 2007

(30) Foreign Application Priority Data

Dec. 16, 2004 (CA) .................................. 2490676

(51) Int. Cl.
*H05K 7/00* (2006.01)

(52) U.S. Cl. ................ 361/760; 361/761; 361/762; 361/728; 361/731; 174/260; 174/259; 174/261

(58) Field of Classification Search ......... 174/260–266, 174/535, 255, 257, 541, 259; 361/760, 761, 361/762, 728, 730, 731, 748–750, 742, 776, 361/777

See application file for complete search history.

(56) References Cited

U.S. PATENT DOCUMENTS

| 5,412,539 | A | 5/1995 | Elwell et al. |
|---|---|---|---|
| 5,731,633 | A | 3/1998 | Clayton |
| 6,049,975 | A | 4/2000 | Clayton |
| 6,512,183 | B2 | 1/2003 | Mitani et al. |
| 6,514,364 | B2 | 2/2003 | Miura et al. |
| 6,530,412 | B1 | 3/2003 | Cronin et al. |
| 6,646,355 | B2 | 11/2003 | Kang et al. |
| 6,666,994 | B2 | 12/2003 | Takezawa et al. |
| 6,675,474 | B2 | 1/2004 | Mitani et al. |
| 6,717,819 | B1 * | 4/2004 | Chung .................... 361/760 |
| 7,132,746 | B2 * | 11/2006 | Brandenburg et al. ....... 257/713 |
| 2004/0188503 | A1 * | 9/2004 | Hua ............................ 228/254 |
| 2004/0262740 | A1 * | 12/2004 | Matayabas et al. .......... 257/706 |
| 2005/0041406 | A1 * | 2/2005 | Matayabas et al. .......... 361/784 |

* cited by examiner

*Primary Examiner*—Dean A. Reichard
*Assistant Examiner*—Hoa C Nguyen
(74) *Attorney, Agent, or Firm*—Joseph Petrokaitis

(57) ABSTRACT

A releasably mountable electronics component is provided. The electronics component comprises a backing having a mounting surface and an electronic module joined to the mounting surface of the backing. The electronic module has electrical contacts disposed on a first side thereof. The electronic module also includes an adhesive covering at least a portion of the mounting surface. The adhesive provides a releasable adhesive for releasably mounting the electronics component to a substrate on which the electronic module is connectable.

6 Claims, 3 Drawing Sheets

RELEASABLY MOUNTABLE ELECTRONICS COMPONENT

FIELD OF THE INVENTION

The present invention relates to electronics components, and more particularly to a releasably mountable electronics component.

BACKGROUND

The installation of electronics components to circuit boards typically requires soldering. Soldered electronics components cannot be easily removed making it more difficult to repair or replace electronics components. Further, the use of lead-based soldering alloys in the electronics mounting is now being regulated in some jurisdictions due to environmental concerns associated with lead.

Two alternatives to soldering which are used in the electronics industry are socket connections and electrically conductive adhesives. Socket connections are well known in the art. Two common drawbacks of socket connections is that they typically increase the size of the circuit board that must be used (usually the thickness), and generally limit the selection and type of circuit boards and electronics components that may be used. For example, socket connections generally cannot be used with flexible circuits. Additionally, electronics components having socket connectors (e.g. pins) must be mounted to circuit boards having corresponding socket connections mounted thereon.

Electrically conductive adhesives are typically formed by dispersing an electrically conductive material in a resin-based adhesive. The terminals of electronics components are connected to those of a circuit board using the electrically conductive adhesive after which the adhesive is cured to secure the connection. This process is typically implemented in a manufacturing process of an electronic device containing the electronics component. After the adhesive has been cured, it is difficult to remove the electronics component, for example, for repair or replacement of the electronics component. Typically, the electronics component must be removed forcibly and, when removed, leaves behind a portion of the electrically conductive adhesive on the circuit board electrodes requiring cleanup and complicating the process of replacing or re-installing the repaired electronics component. Some electrically conductive adhesives use a thermoplastic resin in an attempt to allow the electronics components to be removed more easily. However, known electrically conductive adhesives of this type typically lack sufficient connection strength for mounting electronics components. Further, this type of adhesive typically softens at elevated temperatures. The application of heat softens the adhesive allowing the electronics component to be removed. Thus, removal of the electronics component requires apparatus for heating the device and introduces the potential to thermally damage the electronics component or other parts of the electronic device. Further, when the adhesive is heated and the electronics component is removed, a portion of the adhesive is often left on the circuit board or substrate requiring cleanup and complicating the replacement process as described previously.

Thus, there remains a need for improvements in releasably mountable electronics components.

SUMMARY

One embodiment of the present invention provides a releasably mountable electronics component which may be removed and (re) installed by an end user. In some applications, the electronics component may be removed and replaced without special equipment or tools, reducing the time and expense of repairing or replacing the electronics component in an electronic device. The releasably mountable electronics component also seeks to reduce the likelihood that the substrate or circuit board of the electronic device may be damaged in a repair or modification operation.

In accordance with one aspect of an embodiment of the present invention, there is provided for a releasably mountable electronics component, comprising: a backing having a mounting surface; an electronic module joined to the mounting surface of the backing, the electronic module having a plurality of electrical contacts disposed on a first side thereof; and an adhesive covering at least a portion of the mounting surface of the backing, the adhesive providing a releasable adhesive for releasably mounting the electronics component to a substrate on which the electronic module is connectable.

In accordance with another aspect of an embodiment of the present invention, there is provided a releasably mountable electronics component, comprising: a backing having a mounting surface; an electronic module attached to the mounting surface of the backing, the electronic module having a plurality of electrical contacts disposed on an outwardly oriented first side thereof; and an adhesive covering the electrical contacts and at least a portion of the mounting surface, the adhesive including electrically conductive regions overlaying the electrical contacts of the electronic module and being substantially non-conductive elsewhere, the adhesive providing a releasable adhesive for releasably mounting the electronics component to a substrate on which the electronic module is connectable.

Another embodiment of the invention provides a method for making embodiments of the present invention.

Other aspects and features of embodiments the present invention will become apparent to those ordinarily skilled in the art upon review of the following description of specific embodiments of the invention in conjunction with the accompanying figures.

BRIEF DESCRIPTION OF THE DRAWINGS

Reference will now be made to the accompanying drawings which show, by way of example, embodiments of the present invention, and in which.

Similar references are used in different figures to denote similar components.

DETAILED DESCRIPTION OF THE EMBODIMENTS

Figure 1:
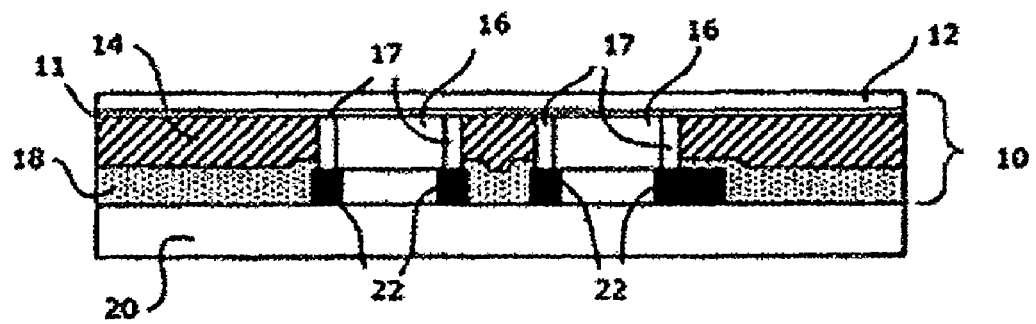
FIG. 1 is a cross-sectional view showing one embodiment of a releasably mountable electronics component according to practicing the present invention.
Figure 4:
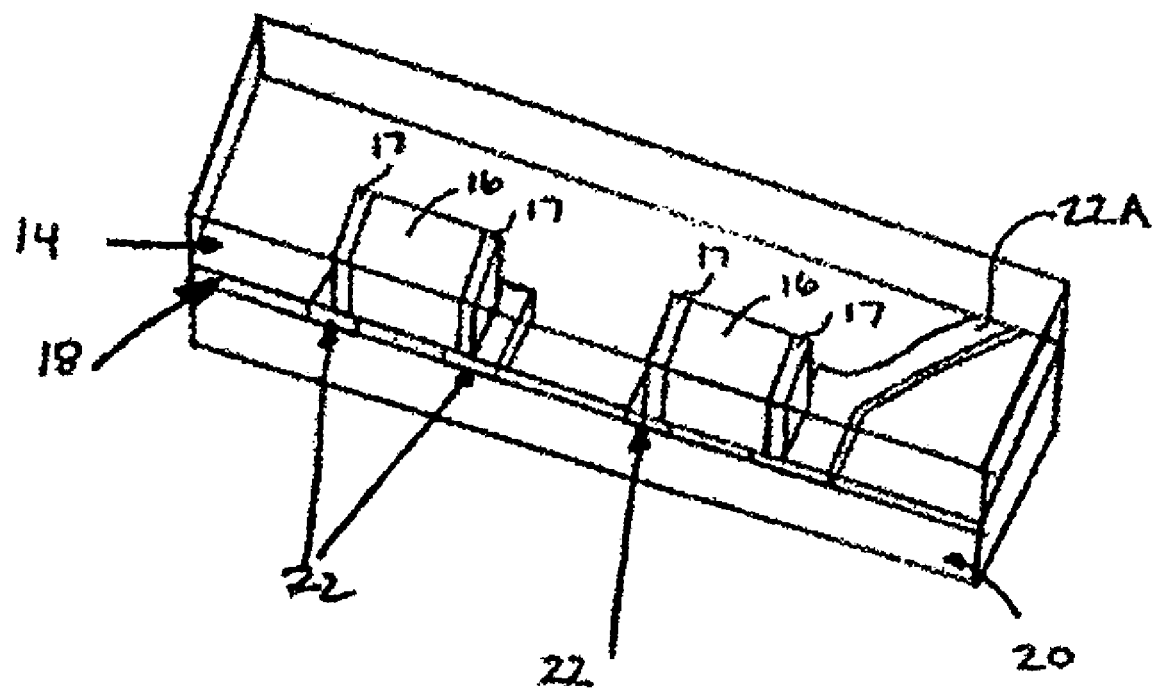
FIG. 4 is a perspective view of the releasably mountable electronics component of FIG. 1 without the backing.

Reference is first made to FIG. 1 and 4, which show one embodiment of a releasably mountable electronics component 10 according to the present invention. The electronics component 10 comprises a flexible backing or substrate 12 having a mounting surface 11, a spacing member 14, electronic modules 16, and an adhesive layer 18. In FIG. 1, the electronics component 10 is mounted to a substrate 20 having a number of electrical contacts 22 and 22A on which electronics components or modules may be mounted. The electrical contacts may be connecting pads, leads or conductive traces. In the shown embodiment, the electrical contact 22A is a conductive trace. In some embodiments, the substrate 20 is a printed circuit board, however it may be any type of substrate capable of receiving electrical components or modules.

The backing 12 supports and protects the electronic modules 16. In some embodiments, the backing 12 is flexible yet sufficiently strong to support the electronic modules 16. In some embodiments, the backing 12 may also have ridges or ribs (not shown) to increase the strength of the backing 12. The spacing member 14 formed of a flexible, non-conductive material. In the shown embodiment, an adhesive is provided on the mounting surface 11 of the backing 12 for mounting the spacing member 14 and electronic modules 16 thereto.

Each electronic module 16 includes a body and electrical contacts 17 such as leads. The electronic modules 16 may be surface mounted components, such as, for example, light emitting diodes (LEDs), resistors, capacitors, switches, processors, microcontrollers, memory devices, semiconductor chips or integrated circuit chips. As will be appreciated by one of ordinary skill in the art, the present invention is not limited to any specific type of electronics component and may be used with other types of surface mountable devices.

The adhesive layer 18 extends between the electronic modules 16 and covers at least a portion of the spacing member 14. The adhesive layer 18 may be a ready-to-use adhesive that does not requiring curing or setting. In some embodiments, the adhesive layer 18 is formed of a re-useable or non-permanent adhesive that allows the component 10 to be removed and (re)mounted several times. The adhesive layer 18 may be formed of a non-conductive adhesive to reduce the formation of short circuits.

In the shown embodiment, the regions between the electronic modules 16 and the electrical contacts 22, 22A are bare of adhesive providing an air gap or space between the electrical contacts 22 when the component 10 is mounted. The adhesive layer 18 may be applied using masking techniques so that adhesive is only applied to the spacing member 14 or backing 12, leaving the electrical contacts 17 of the electronic modules 16 exposed. When the electronics component 10 is mounted to the substrate 20, the modules 16 and electrical contacts 22 are placed in direct physical contact which provides an electrical connection between them. In other embodiments, an electrically conductive contact aid may overlay the electrical contacts 17 to improve the electrical connection between the electronic modules 16 and the electrical contacts 22. For example, the electrical contacts 17 may be coated with a conductive paste, gel, or cream. The component 10 may be configured to provide a gap or recess for receiving the contact aid in the region opposite the electrical contacts 17. When the electrical component 10 is attached to the substrate 20, the conductive paste will improve the contact between the electrical contacts of the component 10 and substrate 20, thereby improving the electrical connection. In other embodiments, an electrically conductive adhesive covers the electrical contacts 17 of the electronic modules 16. The electrically conductive adhesive permits a releasable/removable connection between the electrical contacts 17 and the electrical contacts 22 and improves the electrical connection therebetween. In some embodiments, an electrical contact may be printed on an outer surface of the electrically conductive adhesive using conductive ink or other suitable material.

The releasably mountable electronics component 10 may also have a protective covering (not shown) which overlays the adhesive layer 18. The protective cover may be made of a release material such as Teflon® to provide an easily removable covering. During mounting or installation of the releasably mountable electronics component 10, the protective covering is removed by, for example, peeling off the protective covering to expose the adhesive layer 18.

The shape and size of the backing 12 or the "footprint" of the releasably mountable electronics component may be sized and configured to match the electronic module. For example, in applications where the electronics component includes only one electronic module, the size of the backing and therefore the electronics component may be the same as that of the electronic module.

In some embodiments, the outer surface of the backing 12 may have images and/or text or other indicia printed or otherwise received thereon. The images and text may contain any desired representations, and in some embodiments, may include indications of orientation, such as arrows, for use by an end user when the electronics component is mounted to a substrate.

Figure 2:
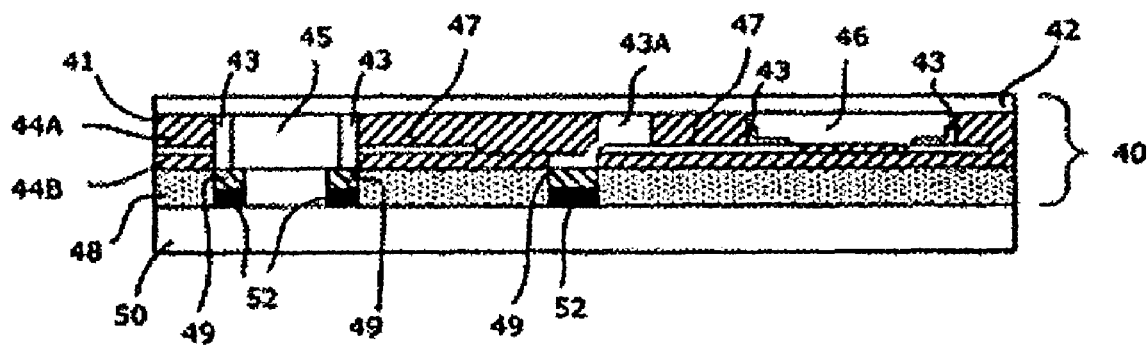
FIG. 2 is a cross-sectional view showing another embodiment of a releasably mountable electronics component according to practicing the present invention.

Reference is next made to FIG. 2, which shows another embodiment of a releasably mountable electronics component 40 according to the present invention. The releasably mountable electronics component 40 comprises a flexible backing or substrate 42 having a Mounting surface 41, upper and lower spacing members 44A and 44B, a first electronic module 45, a second electronic module 46, and an adhesive layer 48. A circuit or conductive trace 47 may also be provided. In FIG. 2, the electronics component 40 is mounted to a substrate 50 having a number of electrical contacts such as electrical contacts 52 on which electronics components or modules may be mounted. In some embodiments, the substrate 50 is a printed circuit board, however it may be any type of substrate capable of receiving electrical components or modules.

The adhesive layer 48 extends between the electronic modules 45, 46 and covers at least a portion of the lower spacing member 44B. The adhesive layer 48 may be a ready-to-use adhesive that does not requiring curing or setting. In some embodiments, the adhesive layer 48 is formed of a re-useable adhesive that allows the component 40 to be removed and re(mounted) several times. The adhesive layer 48 may be formed of a non-conductive adhesive to reduce information of short circuits.

An electrically conductive adhesive 49 covers the electrical contacts 43 of the electronic modules 45, 46. The electrically conductive adhesive 49 permits a releasable/removable connection between the electrical contacts 43 and the electrical contacts 52 and improves the electrical connection therebetween. In the shown embodiment, an air gap or space is provided between the electrical contacts 52 of the substrate 50 in the area in front of or opposite the electronic module 45.

In some embodiments, an electrical contact may be printed on an outer surface of the electrically conductive adhesive 49 using conductive ink or other suitable material. Masking techniques may be used to apply the adhesive when manufacturing the component 40 to create electrically conductive regions (i.e. the adhesive 49) overlaying the electrical contacts 43 of the electronic modules 45, 46 while being substantially non-conductive elsewhere (i.e. the adhesive layer 48).

The backing 42 supports and protects the electronic modules 45, 46. In some embodiments, the backing 42 is flexible yet sufficiently strong to support the electronic modules 45, 46. In some embodiments, the backing 42 may also have ridges or ribs (not shown) to increase the strength of the backing 42. The spacing members 44A and 44B are formed of a flexible, non-conductive material, and are held together, for example, using an adhesive.

Each electronic module 45, 46 includes a body and electrical contacts 43 such as leads. The electronic modules 45, 46 may be surface mounted components, such as, for example, light emitting diodes (LEDs), resistors, capacitors, processors, microcontrollers, memory devices, semiconductor chips or integrated circuit chips. As will be appreciated by one of ordinary skill in the art, the present invention is not limited to any specific type of electronics component and may be used with other types of surface mountable devices. In the shown embodiment, the electronic module 45 is a standard or "off the shelf" SMD and the electronic module 46 is a semiconductor package such as JEDEC Code S-PLGA-N or S-PDSO-N package.

The conductive trace 47 may be printed on the mounting surface 41 or one of the spacing members 44A, 44B, or may be provided on a separate circuit, such as a flexible printed circuit. In some embodiments, the flexible circuit is disposed between the spacing members 44A and 44B or between the backing 42 and the electronic modules 45, 46. In the shown embodiment, the conductive trace 47 is provided between the spacing members 44A and 44B, however in other embodiments the conductive trace may be positioned differently. In this embodiment, the conductive trace 47 is printed on a lower surface of the lower spacing member 44B. An electrical contact 43A connects the conductive trace 47 to the conductive adhesive 49 and electrical contacts 52 of the substrate 50.

Conductive traces and methods of forming conductive traces will be familiar to one skilled in the art. In some applications, the conductive trace may be wider than a typical SMD or at least wider than the electrical contacts of an SMD, facilitating (re)installation of the releasably mountable electronics component without significant issues regarding alignment between the electrical contacts of the electronic modules and the conductive trace.

Figure 3:
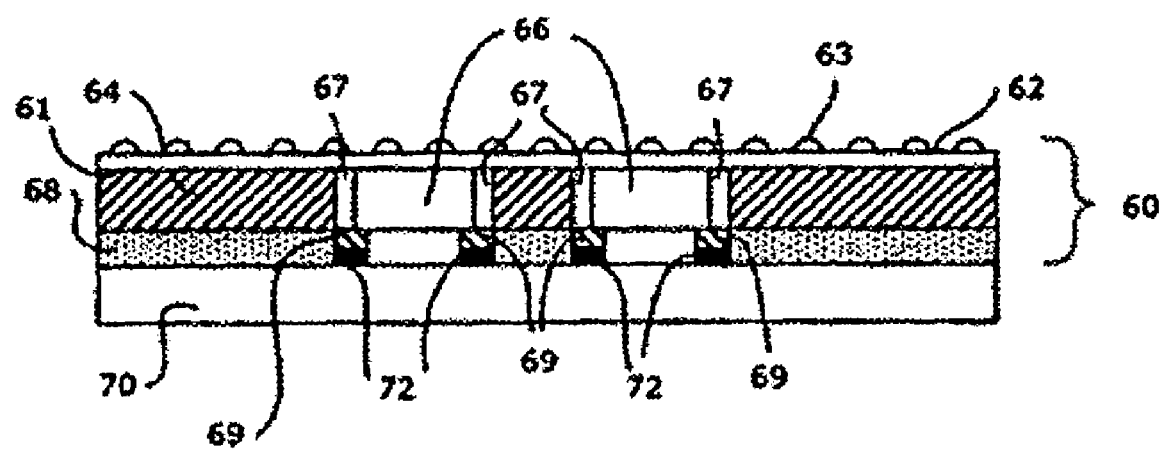
FIG. 3 is a cross-sectional view showing a further embodiment of a releasably mountable electronics component according to practicing the present invention.

Reference is next made to FIG. 3, which shows another embodiment of a releasably mountable electronics component 60 according to the present invention. The releasably mountable electronics component 60 comprises a flexible backing or substrate 62 having a mounting surface 61, a spacing member 64, electronic module 66, and an adhesive layer 68. In FIG. 3, the electronics component 60 is mounted to a substrate 70 having a number of electrical contacts such as electrical contacts 72 on which electronics components or modules may be mounted. In some embodiments, the substrate 70 is a printed circuit board, however it may be any type of substrate capable of receiving electrical components or modules. Although not shown, the releasably mountable electronics component 60 may also include a circuit or conductive trace similar to the conductive trace 47 described above.

The backing 62 supports and protects the electronic modules 66. In some embodiments, the backing 62 is flexible yet sufficiently strong to support the electronic modules 66. In the shown embodiment, the backing 62 comprises a flexible backing layer and a plurality of spaced apart strengthening ribs 63 oriented on an external surface of the flexible backing layer to increase the strength of the electronics component 60. In the shown embodiment, the electronics component 60 has laterally extending ribs 63, however the ribs 63 may be oriented differently in different embodiments. For example, longitudinally extending ribs may also be used. The ribs 63 may be made of the same material as the flexible backing layer, or the ribs 63 may be made of a different material. In some embodiments, the ribs 63 are made of a relatively rigid material to provide increased strength. The spacing member 64 is formed of a flexible, non-conductive material.

Each electronic module 66 includes a body and electrical contacts 67 such as leads. The electronic modules 66 may be surface mounted components, such as, for example, light emitting diodes (LEDs), resistors, capacitors, switches, processors, microcontrollers, memory devices, semiconductor chips or integrated circuit chips. As will be appreciated by one of ordinary skill in the art, the present invention is not limited to any specific type of electronics component and may be used with other types of surface mountable devices.

The adhesive layer 68 extends between the electronic modules 66 and covers at least a portion of the spacing member 64. The adhesive layer 68 may be a ready-to-use adhesive that does not requiring curing or setting. In some embodiments, the adhesive layer 68 is formed of a re-useable adhesive that allows the component 60 to be removed and (re)mounted several times. The adhesive layer 68 may be formed of a non-conductive adhesive to reduce the formation of short circuits.

An electrically conductive adhesive 69 covers the electrical contacts 67 of the electronic modules 66. The electrically conductive adhesive 69 provides a releasable/removable connection between the electrical contacts 67 and the electrical contacts 72 and improves the electrical connection therebetween. In the shown embodiment, an air gap or space is provided between the electrical contacts 72 of the substrate 70 in the area in front of or opposite the electronic modules 66.

In some embodiments, an electrical contact may be printed on an outer surface of the electrically conductive adhesive 69 using conductive ink or other suitable material. Masking techniques may be used to apply the adhesive when manufacturing the component 60 to create electrically conductive regions (i.e. the adhesive 69) overlaying the electrical contacts 67 of the electronic modules 66 while being substantially non-conductive elsewhere (i.e. the adhesive layer 68.)

The materials suitable for use in the present invention are those familiar to a person skilled in the art. The following materials are suitable for use in the present invention but it should be understood that the practice of the present invention is not limited to these materials. That is, materials suitable for use as the backing 12, 42, 62 may be, for example, a plastic, paper or any other nonconductive and flexible material. Adhesive materials for the mounting surface 11, 41, 61 of the backing 12, 42, 62 could be thermoset adhesives that are crosslinked using heat and/or heat and pressure or flexible epoxy adhesives. Materials for the spacing layer 14. spacing members 44A, 44B and spacing member 64 may include vinyl plastic or any other nonconductive flexible material. Adhesive layer 18, 48, 68 may be made from a nonconductive pressure sensitive adhesive such as an acrylic based adhesive. The electrically conductive adhesive described with respect to FIGS. 1 to 4 may be, for example, an electrically conductive tape pressure sensitive adhesive such as 3M XYZ Axis Electrically Conductive Tape available from 3M, St. Paul, Minn.

In some embodiments, an advantage of the present invention is that an electronics component may be replaced with relative ease by end users of electronic devices without soldering equipment or the use of sockets as is typically required when replacing electronics component such as surface mounted devices (e.g. LEDs). In one example embodiment, the releasably mountable electronics component may be used to repair or modify consumer electronics devices by an end user. Many electronics devices are now designed to allow the purchaser or end user to perform limited after-market modifications. Using the present invention, for example, the LED backlight of a phone, such as a cellular phone, may be replaced to modify the colour of the LED backlight. According to some example embodiments, a user may remove an existing LED-based releasably mountable electronics component by peeling off a releasably mountable electronics component from its underlying substrate or circuit board, and replacing it with another having an LED with the colour of the user's choice.

In other applications, releasably mountable electronics components constructed according to the present invention may be used for processors operating at relatively high frequencies. At higher frequencies, the conventional pin or socket used to connect a processor to a circuit board becomes more sensitive to radio frequency (RF) and may act as a small antenna. As the releasably mountable electronics component does not contain components which are particularly sensitive to RF, this problem may be mitigated or eliminated in some applications.

In some embodiments, the releasably mountable electronics component may provide a component that is thinner than conventional replaceable processors which typical use a pin or socket design, exhibits reduced interference from RF, and has lower production costs. Further, in some embodiments, the releasably mountable electronics component may provide improved heat dissipation as a result of increased surface area on both sides of the component relative to conventional processors where the socket side cannot typically dissipate heat effectively due to the presence of a large air gap. In some applications, the releasably mountable electronics component provides improved repair characteristics and relatively high connection strength between the substrate or circuit board to which it is mounted.

In some embodiments, the electronic modules of the releasably mountable electronics component may be more complex circuits. For example, in some example embodiments a wireless network card module may be used.

Another application of releasably mountable electronics component constructed according to the preset invention is in custom circuit design. For example, the releasably mountable electronics component may be used for educational purposes. A circuit may be designed and prepared by a student, for example, by forming a conductive trace on a suitable substrate. The conductive trace may be formed using a conductive pen, such as those sold under the Circuit Works™ trade name. Conductive trace pens contain an air drying conductive trace fluid. Conductive trace pens are often silver based. Depending on the particular pen selected and the size of its tip, the trace may be relatively small allowing finer circuits to be prepared. One or more releasably mountable electronics components having discreet electronic modules may then be mounted on to the conductive circuit trace to complete the circuit.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

The embodiments of the invention in which an exclusive property or privilege is claimed are defined as follows:

What is claimed is:

1. A releasably mountable electronics component, comprising:
   a backing having a mounting surface;
   an electronic module joined to the mounting surface of the backing, the electronic module having a plurality of electrical contacts disposed on a first side thereof; and
   an adhesive covering at least a portion of the mounting surface of the backing, the adhesive providing a releasable adhesive for releasably mounting the electronics component to a substrate on which the electronic module is connectable, wherein an area between said electronic module and said substrate is bare of said adhesive and said adhesive is in contact with the electrical contacts.

2. The electronics component as claimed in claim 1, wherein the adhesive extends around the electronic module allowing the electrical contacts to extend therethrough.

3. The electronics component as claimed in claim 1, further comprising an electrically conductive contact aid covering the electrical contacts of the electronic module.

4. The electronics component as claimed in claim 1, further comprising a spacing member disposed between the backing and the adhesive, the spacing member defining an opening allowing the electronic module to extend therethrough.

5. A method of manufacturing a releasably mountable electronics component, having:
   a backing with a mounting surface; and,
   an electronic module joined to the mounting surface of the backing, the electronic module having a plurality of electrical contacts disposed on a first side thereof; comprising
   covering at least a portion of the mounting surface of the backing with the releasable adhesive for releasably mounting the electronics component to a substrate on which the electronic module is connectable, wherein an area between said electronic module and said substrate is bare of said adhesive and said adhesive is in contact with the electrical contacts.

6. The method as claimed in claim 5, wherein the adhesive is deposited around the electronic module allowing the electrical contacts to extend therethrough.

* * * * *

UNITED STATES PATENT AND TRADEMARK OFFICE
CERTIFICATE OF CORRECTION

PATENT NO.       : 7,630,206 B2                                    Page 1 of 1
APPLICATION NO.  : 11/306078
DATED            : December 8, 2009
INVENTOR(S)      : Derek Kwan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 674 days.

Signed and Sealed this

Second Day of November, 2010

David J. Kappos
*Director of the United States Patent and Trademark Office*